Nov. 7, 1961 R. C. SWENGEL 3,008,112

CONNECTOR MEANS FOR CIRCUIT BOARD

Filed March 12, 1958 2 Sheets-Sheet 1

INVENTOR.
Robert C. Swengel
BY
Curtis, Morris + Safford
ATTORNEY

Nov. 7, 1961 R. C. SWENGEL 3,008,112

CONNECTOR MEANS FOR CIRCUIT BOARD

Filed March 12, 1958 2 Sheets-Sheet 2

INVENTOR.
Robert C. Swengel

BY

Curtis, Morris & Safford

ATTORNEY

United States Patent Office 3,008,112
Patented Nov. 7, 1961

3,008,112
CONNECTOR MEANS FOR CIRCUIT BOARD
Robert C. Swengel, Hellam, Pa., assignor to AMP Incorporated, Harrisburg, Pa.
Filed Mar. 12, 1958, Ser. No. 720,938
8 Claims. (Cl. 339—17)

This invention relates to improvements in connectors for circuit boards and, more particularly, to circuit boards of the type having circuits printed thereon.

Printed circuits are at present in wide use and comprise a panel of electrical insulating material which may be either of sheet stock material or suitably molded substantially into sheet-like form. A wide variety of synthetic resins, as well as other electrical insulating material, are used to form such boards. Electrical circuits are formed thereon in various ways such as, for example, by electro-deposition of a thin plating of copper or the like upon the board, or pressing foil-type copper or other suitable metal against or into one or both surfaces of the board, various means being used to bond the metal foil to the board. In general, a circuit principally comprising electrical conductors of this type may be formed upon or applied to an insulating board in satisfactory manner. Also, the board may be drilled, punched, or molded to provide sockets which are to receive leads of electrical components, prongs from such components, or the like, and it is necessary to provide a connection between said leads or prongs and the electrical conductors extending along the insulating panel or board.

In circuit boards of this type, portions of the circuit members either surround or extend into the socket openings in the board. In order to establish firm connection between such circuit conductor or projection thereof into sockets and a component lead or projection inserted thereinto, it is essential at present to solder such connection. Soldering is commonly performed at present by dipping a panel board, while the component leads are held inserted within the sockets thereof, into a molten bath of solder. The solder will only adhere to the metallic members and not to the exposed portion of the panel board which is formed from resin or the like.

While such a soldered connection would seem to form a suitable construction from the standpoint of establishing a circuit between the components and the panel board conductors, such operations are a matter of considerable expense and provide poor mechanical securement and questionable reliability in long term usage due to differing temperature coefficients between the conductors, solder and the insulating material comprising the board. Also a serious difficulty resulting from the use of soldered connections comprises various problems encountered in replacing electrical components in such circuits. Circuit boards frequently have components arranged thereon in close and even overlapping relationship, the sockets thereby frequently being in very close proximity to each other. Hence, to melt the solder in a certain socket or pair of sockets, to replace a component, frequently is a tedious operation and often the melting of the solder in one socket will melt the solder in adjacent sockets of other components which are not to be replaced. Further, it is sometimes necessary to remove a number of electrical components, to test them individually, for example. This requires the melting of a substantial number of soldered connections and likewise the resoldering of the same when the components are replaced within the circuit or new ones are substituted therefor in the circuit.

Further, since this servicing or repairing is usually done after the electrical equipment is in field use, the technical competence of the servicing personnel may not be all that could be desired. Frequently the circuits are relatively fragile and the mechanical bond holding them onto the insulation panel is susceptible to excessive localized heat. Service personnel may ruin a board almost beyond repair in attempting to remove or replace a soldered component lead.

The principal object of the present invention is to obviate the above described deficiencies and difficulties by providing a circuit panel board formed from insulating material and having a socket opening formed therein and into which part of the metallic circuit extends, the construction of the socket being such as to provide a solderless frictional connection of the circuit to a lead or prong-like member of an electrical component.

Another object of the invention is to provide a socket in a circuit panel board which preferably comprises a spud-like projection or boss extending from one surface of the panel board, said boss containing at least a portion of the socket formed therein so as to provide a greater depth for the socket and consequent increased area of electric circuit contact than would be afforded solely by the thickness of the panel board. The socket either is lined substantially entirely with metal connected to the circuit conductors or a portion of said conductors extends into said socket to a desired depth.

A further object of the invention, ancillary to the foregoing, is to slot the aforementioned hollow spud or boss from the outer end thereof toward the panel board to provide a plurality of finger-like means which at least partially define the wall surfaces of the socket, whereby said socket can be expanded more readily for purposes of receiving and mechanically engaging a lead or prong of an electrical component of greater cross-sectional dimension than the socket.

Still another object of the invention is to supply a resilience in, or to enhance the inherent resilience of the circuit board panel material to effect a firm mechanical connection between the walls of such socket in the panel board and the lead or prong of an electrical component by providing mechanical constricting means applied either individually or collectively to the projecting spud-like bosses or finger-like members comprising the same and defining said socket.

Details of the foregoing objects and of the invention, as well as other objects thereof, are set forth in the following specification and illustrated in the accompanying drawing comprising a part thereof.

Figures 5, 6:
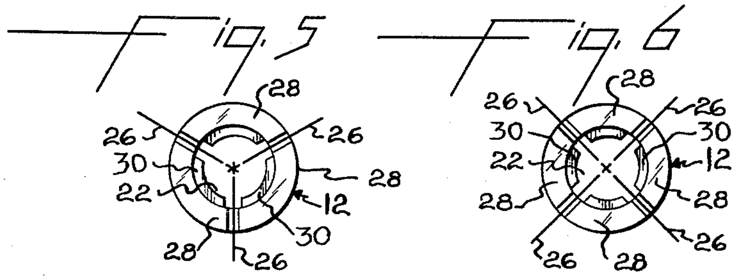

FIGURES 5 and 6 respectively are diagrammatic end views of a socket illustrating different patterns for slotting the socket to enhance the elasticity thereof.

Figure 7:
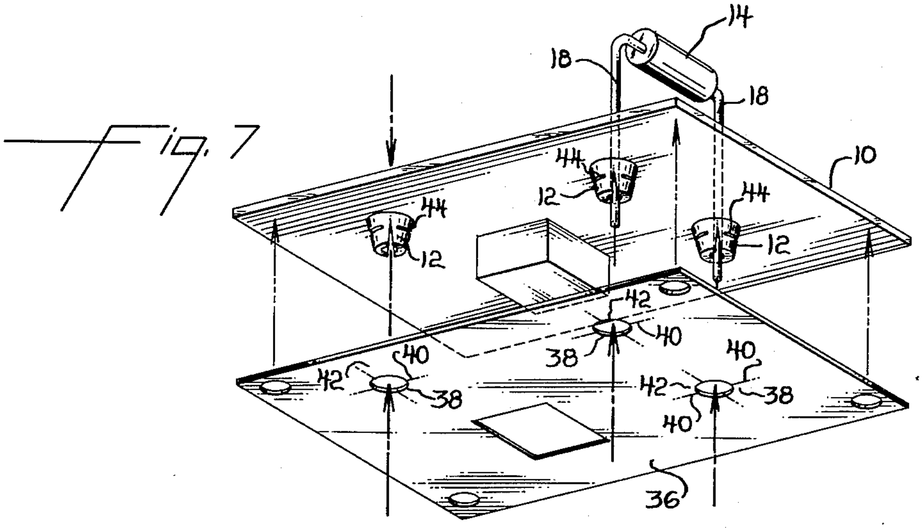

FIGURE 7 is a perspective exploded view of the lower surface of an exemplary circuit board provided with sockets and a collective type of constricting means positioned for connection to said sockets.

Figure 8:
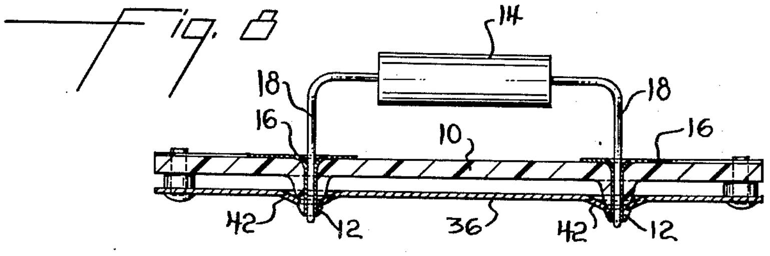

FIGURE 8 is a longitudinal sectional view of the circuit board assembly shown in FIGURE 7 after the collective locking means has been connected operatively to the sockets of the circuit board.

Figure 1:
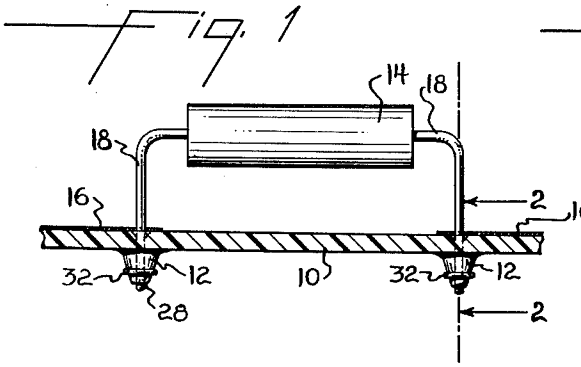
FIGURE 1 is an exemplary side elevation of a section of circuit panel board having a circuit thereon and shown fragmentarily in cross-section, sockets being provided on the panel board, and an exemplary electrical component being mounted with the leads thereof received within said sockets in accordance with the principles of the present invention.
Figure 2:
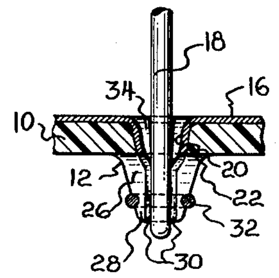
FIGURE 2 is an enlarged vertical sectional view of one embodiment of one of the sockets shown in FIGURE 1 with a lead of the component mounted therein as seen on the line 2—2 of FIGURE 1.
Figure 3:
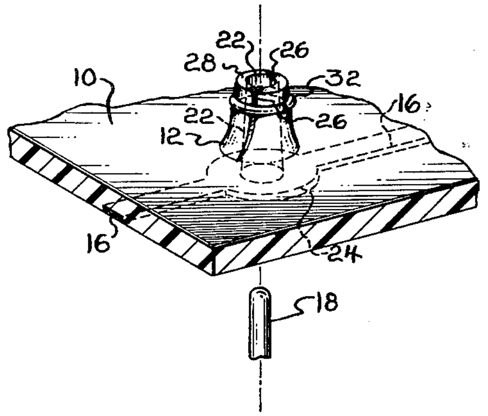
FIGURE 3 is an exploded perspective fragmentary view of the bottom surface of the panel board, relative to FIGURE 1, illustrating the embodiment of connector socket shown in FIGURE 2, a fragmentary portion of a component lead being illustrated in position for insertion into said socket.

Referring now to FIGURES 1 through 3, there is shown a section of an exemplary circuit panel board 10 having a plurality of socket-forming integral spuds or bosses 12 extending from one surface of said board and preferably appreciably longer than the thickness of said board, and located at desired positions where connections are to be made between an electrical component 14, for example, and metallic circuit conductors 16. The axes of the sockets preferably are transverse to the board and extend axially through said spuds. The prong-like members such as the leads 18 of the exemplary component 14 are of slightly greater cross-sectional dimension than the sockets formed within the bosses 12 and are inserted axially into said socket.

It is to be understood, of course, that any of a variety of techniques known in the art may be employed to shape the circuit board and spuds as shown, for example by molding or casting from suitable plastics or synthetic resins of either thermosetting or thermoplastic types, so as to form a board which may be relatively stiff but having sufficient flexibility and resilience for the purposes to be described. Moreover, the present invention is not intended to be restrictive as to the method or means by which the metallic circuit conductors 16 are applied or affixed to the board 10. In the exemplary illustration shown herein, it is assumed that the circuit conductors 16 are of relatively thin sheet metal, such as copper foil, and have been affixed to the board suitably to retain the same connected thereto in all conditions of use.

It also is to be understood that the leads 18 are merely exemplary of prong-like means which may be inserted within the socket 22. Further, the dimension of the interior of the socket 22 which is formed within each boss 12, is selected so that firm mechanical connection of substantial area will be established between the prong-like member 18 and the circuit within said socket 22, such area being far greater than is possible, for example, simply by forming socket apertures in the relatively thin board 10 per se.

Although the illustration in FIGURE 2 shows one exemplary manner by which the circuit means may be disposed within socket 22, it will be understood that mechanical connection may be effected between the prong-like member 18 and the metallic circuit conductors 16 when, for example, a single ribbon extension of the conductor 16 extends axially into the socket 20, such extension being placed there by a suitable punch or shaping tool. By the use of such connector means between a prong-like insertable member, such as lead 18, and the extension 20 of the circuit conductors 16, mechanical and electrical connection of substantial area will be established which is sufficiently firm to render unnecessary conventional soldering as is now substantially universally required in the connecting and securement of electrical components to conventional circuit panel boards.

The component 14 is merely exemplary of a wide variety of electrical components which may be connected to a circuit panel board, preferably of the so-called printed circuit type. Such components for example may be a condenser, resistor, or any one of a substantial number of similar components. In addition, it is intended that the leads 18 are representative of prongs of the type for example connected to vacuum tubes of various kinds, said prongs usually being arranged in a circular pattern and projecting from one end of such vacuum tubes. Under such circumstances, a complementary pattern of sockets 22 will be provided, the same having circuit conductors 16 connected to the extensions 20 thereof which are disposed within the interior of the sockets 22.

When the circuit conductors 16 are affixed to the panel board 10, it will be seen by reference to FIGURE 3 particularly that the sockets 22 usually are surrounded by an enlargement 24 in the circuit conductor 16. Particularly where the circuit conductor 16 and enlargement 24 are affixed by adhesive to one surface of the panel board 10, or are recessed into one surface thereof and bonded thereto as specifically illustrated in FIGURE 3, swaging or punching of funnel-shaped portions 20 therefrom from strips of the necessary length into the sockets 22 readily is feasible. Hence, FIGURE 3 represents an exemplary board 10 within which the metallic circuit conductors 16 have been pressed or molded so as to be substantially flush with the lower surface thereof as viewed in FIGURE 3, said surface usually comprising the upper surface of the panel board.

The slightly greater cross-sectional dimension or diameter of the member 18, when inserted into socket 22 will cause the socket walls to expand. To facilitate such expansion, the spud or boss 12 preferably is provided with one or more axially extending, radial slots 26 which preferably extend from the outer end of the boss toward or through the panel board 10. In the embodiment specifically shown in FIGUES 1 and 2, a single diametrical slot 26 is illustrated as extending across the boss 12. Slots of this type result in the formation of two or more fingers 28 which at least partially define the socket walls. The use of a single diametrically extending slot 26 however is not to be regarded as restrictive, FIGURES 5 and 6 illustrating, in diagrammatic form, other exemplary slot arrangements. Thus, in FIGURE 5, three mutually opposed slots are formed in the socket sidewalls, FIGURE 6 showing a pair of crossed diametrically extending slots. The fingers formed as a result of such slots will be sufficiently resilient to permit expansion to receive member 18 and firmly grip the same when inserted within the socket.

Figure 4:
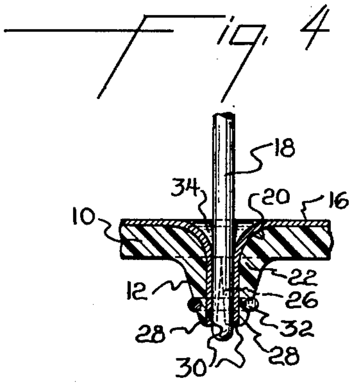
FIGURE 4 is a view similar to FIGURE 2 but showing a slightly different embodiment of shape of the socket and metallic lining therein.

Under circumstances particularly where the circuit conductors 16 are formed upon the panel board 10 by electrical deposition for example, it will, of course, be possible to form the cup-like portion 20 of conductor 16 by electrical deposition also. Accordingly, the interior 22 of the socket also may have metallic extensions 30 along fingers 28 which will be integral with the portion 20 of the circuit, all of the same being formed simultaneously by such electrical deposition. Further, only one or more strips of such metallic extensions 30 may be provided, or the entire interior of the socket and fingers may be coated with conducting metal, thereby providing a maximum amount of contact area with the prong-like members inserted thereinto such as leads 18. Preferably the socket opening 34, FIGURES 2 and 4, is outwardly flared to a diameter greater than member 18, whereby only the walls of the spud 12, or annular projection, will expand. The socket opening 34 in FIGURE 4 is somewhat less extensive than in FIGURE 2 and such openings within the board 10 facilitate the insertion of the members 18 into socket opening 22.

As thus constructed, laterally extending fingers 28 deflect generally in the nature of cantilever beams on insertion of a lead prong in the associated socket. The restoring force generated in the board material as a consequence of such deflection effects a frictional grip on the lead prong thereby providing the desired solderless frictional connection between the lead prong and the printed circuit segments which extend into the socket.

Where, however, the material desired for use in forming the base of paney 10 is unsuitable for generating an adequate degree of restoring force, or is unlikely to maintain the proper degree over extended periods, for example, by virtue of the tendency of some resins or plastics to creep under pressure and temperature, auxiliary constricting means having the desired restoration characteristic may be applied to the socket fingers. To this end an exemplary form illustrated in connection with FIGURES 1 through 4 comprises a snap-ring 32 formed from suitable metallic stock which extends around the periphery of said fingers near their outer ends and urges the same, together with the circuit means thereon, radially inward. Thus, a snubbing action, substantially independent of the characteristics of the base panel material, is afforded on lead member 18 when inserted between the socket walls and withdrawal is attempted. Such snubbing action may be overcome, of course, by firmly pulling member 18 out of the socket. To position the snap-ring 32 easily and simply, a suitable annular groove, providing a seat therefor, may be formed upon the circumference of the boss 12 or fingers 28, and the outer end surfaces thereof preferably are tapered as shown particularly in FIGURES 2 and 4 for purposes of facilitating the mounting of the snap-ring within said annular seat.

Rather than affix the snap-ring 32 individually to the bosses 12, this procedure may be considerably expedited by utilizing a collective type constricting means specifically illustrated in FIGURES 7 and 8 as a sheet 36 which may be formed from any suitable resilient material. Sheet metal is preferred but synthetic resins of good elastic memory are appropriate. Said sheet may be relatively thin and the area thereof need only be coextensive with the area of the panel board 10 occupied by the bosses 12. The sheet 36 is provided with a plurality of apertures 38 positioned therein to correspond to the positions of the bosses or spuds 12. Radial slots 40 of desired number extend outwardly from the apertures 38 which may also be suitably formed to provide a plurality of flexible tongues 42. The apertures 38, formed or flat, preferably are slightly smaller than the mean diameter of the exterior of the tapered bosses 12, as shown in FIGURE 8, and intermediately of the ends of the bosses, the notches 44 receive the outer ends of tongues 42 and thereby retain the tongues in flexed condition to provide constant pressure radially inwardly upon the walls of the bosses 12 and afford a snubbing action upon attempting withdrawal of a lead prong therefrom. This firmly connects the metallic extensions 30 within the sockets of bosses 12 with the leads of components disposed therein but removal of such leads takes place by firmly pulling the same from the socket. Attachment of the sheet 36 to the bosses 12 is accomplished quickly and the flexible tongues 42 function somewhat as one-way clutches to effect the firm circuit connections described above.

Neither the constricting snap-rings 32 nor the collective constricting sheet 36 need be removed after they have been mounted upon the spuds or bosses 12. It is possible to insert the leads 18 or similar component prongs, as on vacuum tubes, forcibly into and remove the same from such socket openings and the electric circuit means therein while such constricting means remain in place.

From the foregoing, it will be seen that the present invention comprises connector means including socketed bosses or spuds formed on a relatively thin circuit board to effect connections of substantial areas between circuit means within sockets in the board and leads or the like of electrical components inserted therein. The inherent resilience and elastic memory of the insulating resin of the circuit board from which the socketed bosses are formed causes the walls of the sockets to hold the circuit means within the socket in firm engagement mechanically and electrically with the leads or the like of the components to be connected with said circuit means. The inherent resilience of the resin from which the socketed bosses are formed is enhanced to effect even more firm connection between the circuit means and the leads of the components by utilizing socket constricting means of several varieties which afford a snubbing action. Hence the need for soldered connections is, for most practical purposes, obviated and quick mounting and replacement of components can be effected by operators of only limited skill.

While the invention has been described and illustrated in its several preferred embodiments, and has included certain details, it should be understood that the invention is not to be limited to the precise details herein illustrated and described since the same may be carried out in other ways falling within the scope of the invention as claimed.

I claim:

1. A molded circuit panel board of insulating material providing a monolithic supporting base for mounting circuit components and having integral spuds, said spuds having annular walls projecting from one surface of said board and each having a socket opening extending substantially axially therethrough, and conductive circuit strips affixed to and extending along said board and into said sockets, the walls of said spuds being slotted radially to provide projections extending transversely to said board and defining a socket appreciably longer than the thickness of said board, whereby when a prong-like member of greater cross-sectional dimension than that of each socket is inserted therein for connection with said circuit strips therein said projections flex radially sufficiently to engage said member firmly and cause a substantial area of the circuit means within said socket to engage said member tightly for firm electrical contact therewith.

2. A molded circuit panel board of insulating material having integral spuds projecting from one surface of said board and each having a socket opening extending substantially axially therethrough, circuit means extending along said board and into said sockets, the walls of said spuds being annular and slotted radially to provide projections extending transversely to said board and defining a socket appreciably longer than the thickness of said board, and constricting means operable upon said projections to urge the same radially inward, whereby when a prong-like member of greater cross-sectional dimension than that of said socket is inserted therein for connection with the circuit means therein said projections flex radially against the action of said constricting means sufficiently to receive said member and said constricting means urging said fingers firmly against said member to cause a substantial area of the circuit means within said socket to engage said member tightly for firm electrical contact therewith.

3. The circuit panel board set forth in claim 2 further characterized by said constricting means comprising snap rings respectively surrounding the projections of each socket.

4. The circuit panel board set forth in claim 2 further characterized by said constricting means being collective and comprising a sheet having a plurality of resilient areas each having an aperture extending therethrough, said apertures being arranged complementarily to said spud projections and respectively receiving said projections when mounted thereupon to constrict the expansion of the projections of each socket.

5. The circuit panel board set forth in claim 4 further characterized by said apertures being slightly smaller than the exterior surfaces of said spuds received therein, said sheet having slots extending from said apertures to form resilient members arranged to be flexed against said exteriors of said spuds when operatively positioned thereon, whereby said flexed members are operable to exert constant constricting force upon the projections of said spuds.

6. The circuit panel board set forth in claim 2 further characterized by said projections of said spuds having grooves exteriorly thereon to receive said constricting means and position the same in an axial direction upon said spuds.

7. In a printed circuit panel board of insulating material, a socket opening therein, socket-forming means integrally connected to and projecting from one surface of said board coaxially with said socket opening, the walls of said socket-forming means being slotted radially from end to end to provide a plurality of fingers positioned circumferentially around the axis of said socket opening and the end of said socket-forming means adjacent said board comprising hinge means of appreciable length connecting one end of each finger to said board and operable to permit lateral movement of said fingers relative to each other and the axis of said socket opening, circuit means extending along said board and into said socket, whereby when a prong-like member of greater cross-sectional dimension than the interior of said socket is inserted within said socket for connection to said circuit means the elastic nature of said hinge means permits movement of said fingers radially away from each other to receive said prong-like member between said fingers, and yieldable constricting means engaging said fingers exteriorly to resist radial movement of the fingers outwardly and cooperating with said hinge means to insure longitudinal contact of the circuit means on the interior of said fingers with said prong-like member when inserted into said socket opening and effect tight parallel engagement thereof with said member.

8. In a printed circuit panel board of insulating material, a socket opening therein provided with an outwardly flared end adjacent one surface of said board, socket-forming means integrally connected to and projecting from the other surface of said board coaxially with said socket opening, the walls of said socket-forming means being slotted radially from end to end to provide a plurality of substantially parallel fingers positioned circumferentially around the axis of said socket opening and the end of said socket-forming means adjacent said board being thinner than said board and comprising hinge means connecting one end of each finger to said board and operable to permit lateral movement of said fingers relative to each other and the axis of said socket opening, circuit means extending along said board and into said socket, whereby when a prong-like member of greater cross-sectional dimension than the interior of said socket is inserted within said socket for connection to said circuit means the elastic nature of said hinge means permits movement of said fingers radially away from each other to receive said prong-like member between said fingers, and a split elastic constricting ring surrounding said fingers and yieldably resisting outward movement thereof, said ring cooperating with said hinge means to insure longitudinal contact of the circuit means within said socket opening with said prong-like member when inserted into said socket opening, thereby effecting tight parallel engagement therebetween.

References Cited in the file of this patent

UNITED STATES PATENTS

| | | |
|---|---|---|
| 1,866,407 | Guett | July 5, 1932 |
| 2,363,295 | Cotter | Nov. 21, 1944 |
| 2,423,548 | Bels | July 8, 1947 |
| 2,683,839 | Beck | July 13, 1954 |
| 2,730,692 | Jongsma | Jan. 10, 1956 |
| 2,869,040 | Pifer | Jan. 13, 1959 |
| 2,973,499 | Hammell | Feb. 28, 1961 |

FOREIGN PATENTS

| | | |
|---|---|---|
| 1,063,811 | France | Dec. 23, 1953 |
| 1,087,104 | France | Aug. 18, 1954 |